United States Patent [19]

Maheux

[11] 3,843,951

[45] Oct. 22, 1974

[54] CONNECTION OF AN ELECTRICAL COMPONENT TO A FLEXIBLE CIRCUIT

[75] Inventor: Peter Francis Maheux, Kanata, Ontario, Canada

[73] Assignee: Bell Northern Research Ltd., Ontario, Canada

[22] Filed: Jan. 26, 1973

[21] Appl. No.: 327,210

[52] U.S. Cl. .......................... 339/17 F, 339/176 MF

[51] Int. Cl. .............................................. H05k 1/04

[58] Field of Search ......... 339/17, 95, 99, 174, 176, 339/59

[56] References Cited

UNITED STATES PATENTS

| | | | |
|---|---|---|---|
| 3,319,216 | 5/1967 | McCullough | 339/176 MF |
| 3,365,694 | 1/1968 | Parker | 339/17 F |
| 3,489,990 | 1/1970 | Parker et al. | 339/17 F X |
| 3,544,950 | 12/1970 | Lopez et al. | 339/17 D X |
| 3,614,707 | 10/1971 | Kaufmann et al. | 339/17 F |
| 3,728,661 | 4/1973 | Kassabgi | 339/17 F |

*Primary Examiner*—Roy D. Frazier
*Assistant Examiner*—Terrell P. Lewis
*Attorney, Agent, or Firm*—Sidney T. Jelly

[57] ABSTRACT

Method of connecting an electrical component to a flexible circuit in which the flexible circuit is positioned in, or over, a formation on a support member and the component has a cooperating formation which is pressed into engagement with the formation on the support member. Contact members on the components are held in electrical contact with the flexible circuit.

1 Claim, 5 Drawing Figures

CONNECTION OF AN ELECTRICAL COMPONENT TO A FLEXIBLE CIRCUIT

This invention relates to the connection of electrical components to flexible circuits, and particularly, though not exclusively, to the connection of integrated circuits to flexible circuits.

An electrical component, in the context of the present description, is intended to be any form of component which is in the form of a module. Connection leads are extended from the module. The circuit in the module may be in the form of a circuit formed on one or more wafers of non-conducting or semiconducting material, individual devices forming the circuit connected in various ways. In another form of circuit a number of individual devices may be electrically interconnected and then encapsulated. Whatever form the electrical component may take, it eventually is in the form of a module which has to be connected to a further circuit.

Known methods of connecting components such as integrated circuits vary. One form comprises a connecting block which is itself connected to the further circuit in a substantially permanent manner, as by soldering, the integrated circuit then plugged into the connecting block. A further form is one in which the leads of the integrated circuit are attached directly to the further circuit —usually by soldering. Both these forms can be applied to flexible circuits, but extreme care has to be taken concerning flexing at the connection to avoid undesirable stresses at solder joints.

While the first described known form provides for the ability to remove and reconnect the integrated circuit, or module, considerable extra space is taken up by the connecting block. Also use of a connecting block between the integrated circuit and the further circuit introduces extra contact points, increasing the possibility of unsatisfactory contacts. The second described known form avoids the use of an intervening connecting block, saving space and reducing the number of contact points, but the integrated circuit is not readily disconnected —or reconnected. The "plug-in" facility is lost.

The present invention is particularly concerned with the connection of electrical components, or modules, to circuits of a flexible form, in which "plug-in" capability is obtained without an intervening connecting block or extra contact points. The component or module is adapted to cooperate physically with a reception formation such that insertion of the component or module results in contact between the leads of the component and the conductors of the flexible circuit, while at the same time physical interengagement occurs between the two parts to maintain the connection. The component can readily be removed and it, or some other component, reconnected easily.

In its broadest aspect the invention provides for the connection of an electrical component to a circuit which is flexible by providing a receptive formation on a support member, the formation of a size and shape to cooperate with a shape or formation on the component with a certain degree of distortion of at least one of the shape or the formation, the flexible circuit extending between the component and the support member. Conveniently, leads extending from the electrical component are bent to provide the contact members in contact with the flexible circuit and also to provide physical engagement with the formation on the support member.

The invention will be readily understood by the following description of certain embodiments, by way of example only, in conjunction with the accompanying drawings in which.

Figure 1:
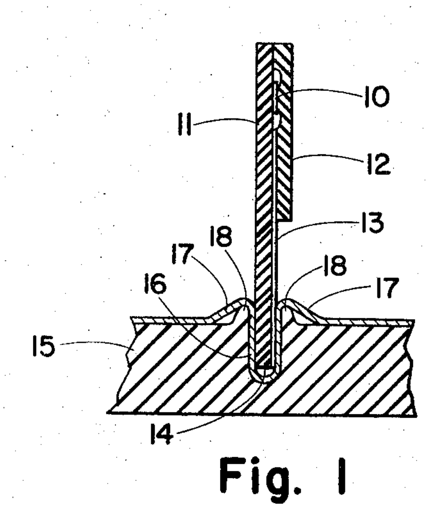
FIG. 1 is a cross-section, on the line 1—1 of FIG. 2, illustrating one form of connecting an encapsulated integrated circuit on a substrate to a flexible circuit.
Figure 2:
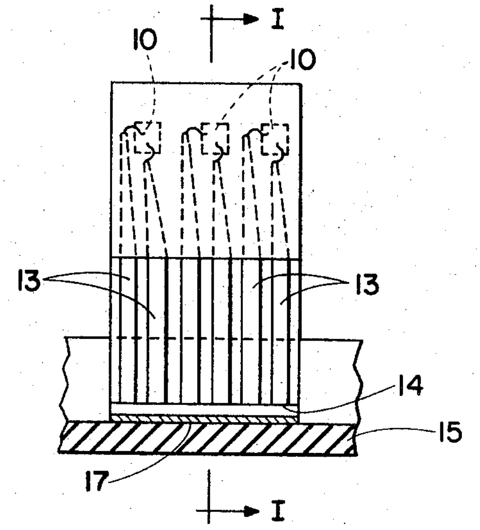
FIG. 2 is a front view of the arrangement illustrated in FIG. 1.

Illustrated in FIGS. 1 and 2 is an extremely simple form of the invention. A number of encapsulated integrated circuits 10 are mounted on a base member or substrate 11, the encapsulant 12 extending over and around the integrated circuits 10. Leads 13 from the circuits 10 extend to the lower edge 14 of the substrate 11. The substrate 11 is intended to be inserted in a support member 15. A recess 16 is formed in the support member and a flexible circuit 17 is positioned on the support member 15 with a fold of the circuit extending down into the recess 16. The end of the substrate is pushed into the recess, the leads 13 arranged to line up with and contact the conductors on the flexible circuit 17.

The recess 16 is formed with the dimension at its upper end slightly reduced relative to the rest of the recess. The support member 15 is of flexible resilient material and the reduced dimension can be obtained by forming slight ridges along the opposed edges of the recess. On insertion of the substrate 11, the ridges are deformed slightly as seen at 18, in FIG. 1.

The resilience of the support member 15, with the distortion produced by insertion of the substrate 11, ensures firm retention of the substrate 11 plus the encapsulated circuits. The leads 13 make good contact with the conductors of the flexible circuit 17. Flexible circuits can be of any suitable form for example the well-known form of copper conductors on a flexible support strip.

Figure 3:
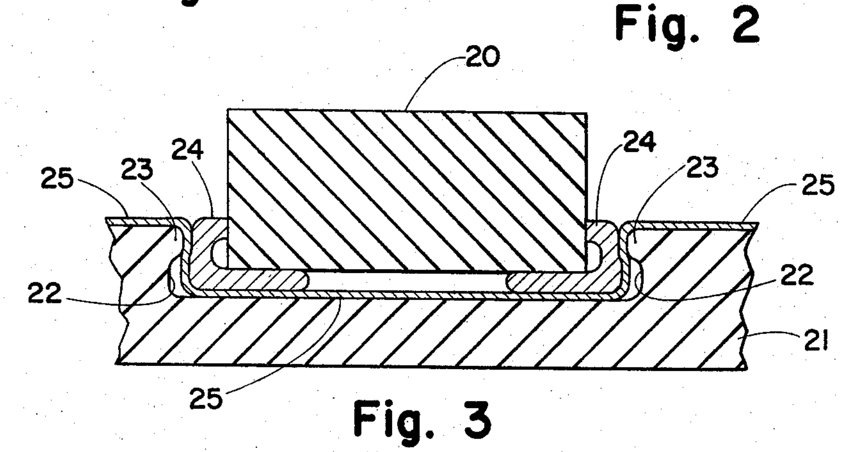
FIG. 3 is a cross-section through a further form of integrated circuit, or module, using leads as connectors.

A further example of the present invention, of slightly more complex form, is illustrated in FIG. 3. In the arrangement illustrated in FIG. 3, an integrated circuit package 20 is to be retained in a member 21, which, for example, is a housing of a telephone set. In such an example the package 20 would comprise an integrated circuit for the telephone set. The member or housing 21 is moulded with a recess 22. The recess is slightly undercut in cross-section, as seen in FIG. 3, with inwardly extending ribs 23 along opposed edges of the recess 22.

In the example illustrated the package 20 is of the normal form with wire leads 24 extending from each end. To use, in the present invention, the leads 24 are bent down and under the package 20, as seen. Before insertion of the package in the recess 22, a flexible circuit 25 is positioned thereover. As the package 20 is inserted the flexible circuit 25 is pushed down into the recess. There is a degree of snap action as the package is pushed into the recess, resulting from the resilience of the leads 24. Also the member on housing 21 can have some resilience.

Figure 4:
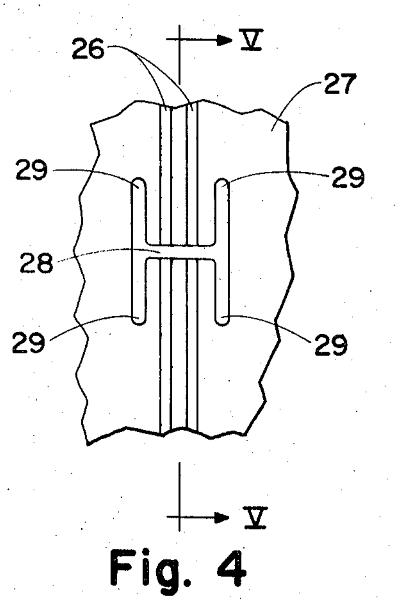
FIG. 4 is a plan view of a part of a flexible circuit prepared for a connection in accordance with the present invention.
Figure 5:
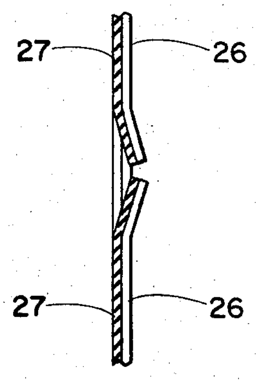
FIG. 5 is a cross-section on the line 5—5 of FIG. 4.

To improve the contact between leads 24 and the conductors of the flexible circuit, the flexible circuit can be cut as seen in FIG. 4. Two conductors 26 are shown carried on a flexible supporting substrate 27. The support and conductors are slit across as at 28, and the supporting substrate 27 is slit for a short distance from the cross-wise slit 28, as seen at 29. The conductors 26 are bent up slightly, as more clearly seen in FIG. 5, to ensure good contact with the backs 24.

More than two conductors 26 can be provided on the flexible circuit 25. Flexible circuit 25 is of any conventional form, for example thin copper conductors on a flexible substrate. The conductors are normally covered by an insulating layer, except in the localities where contact with another part is to occur.

It is possible to manufacture the package 20 with an alternate form of leads 24 specifically designed to cooperate with the flexible circuit 25. Thus leads 24 could be metal strips formed on the outer surface of the package. However using the wire leads 24 as illustrated enables use to be made of existing conventional forms of package.

While the particular specific descriptions above are concerned with integrated circuits, for which the present invention provides considerable advantages, it is possible to use the invention for connecting single components, and also arrangements of multiple components. The main requirement is that the article to be connected to the flexible circuit should be modular in form, that is presenting a shape which can readily be pushed into mating relationship with a flexible circuit by cooperation with a receptive formation. Conveniently, as described, the reception formation is a recess, but it can readily be provided that a recess be formed in the module, which recess can then be positioned over a protrusion, the flexible circuit positioned over the protrusion before the recess is positioned thereover.

The invention provides for a considerable reduction in the number of interconnections often necessary for a system. The number of parts is also reduced. Usually less space is required and a higher interconnecting density is possible.

The increasing use of flexible circuitry gives rise to difficulties in making satisfactory connections to such circuits. At best, expensive and complex techniques are used to provide connections and the number of electrical contact points are increased.

By use of the present invention it is not necessary to provide special termination devices which in turn are interconnected. A complete conductor system can be prepared on a flexible circuit and the related modules —components or circuits— in effect "plugged in" directly onto the flexible circuit by suitably shaping a housing or some similar part. A flexible circuit, plus the modules, is normally housed in a housing or casing and it is easy and inexpensive to provide the special formations at particular positions on the housing for reception of modules. Thus, for example, in a telephone set, the conductors can be in the form of a flexible circuit and integrated circuits and other components connected to the flexible circuit by forming recesses or protrusions at appropriate positions on the telephone set housing for attachment of the various circuits and components. By using integrated circuits there is considerable reduction in size and space requirements. This can enable redesign of the telephone set of a more attractive design.

Components, either as individual components or as integrated circuits, can readily be removed and replaced for servicing. Interconnections are reliable. The cooperating shapes can be made so that incorrect connections cannot be made. Alignment of leads and conductors can be assured by the provision of positioning formations. Stresses in leads and conductors are reduced.

What is claimed is:

1. A method of connecting an electrical component to a flexible circuit in a housing, comprising:

forming a recess in said housing, said recess forming a receptive formation adapted to receive and cooperate with a shape on the component;

forming a rib formation on at least part of the periphery of the recess;

positioning a flexible circuit between said housing and said component;

pressing the component and the housing together to push said shape on the component into physical engagement with the formation on the housing, said rib formation distorting on insertion of the component, the flexible circuit held between the shape and the formation and in electrical contact with the component, the component held in position relative to the housing by the distortion of the rib formation.

* * * * *